US010198533B2

(12) United States Patent
Zeisl et al.

(10) Patent No.: US 10,198,533 B2
(45) Date of Patent: Feb. 5, 2019

(54) REGISTRATION OF MULTIPLE LASER SCANS

(71) Applicant: Hexagon Technology Center GmbH, Heerbrugg (CH)

(72) Inventors: Bernhard Zeisl, Zürich (CH); Kevin Köser, Schwentinental (DE); Marc Pollefeys, Zürich (CH); Gregory Walsh, Walnut Creek, CA (US)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 500 days.

(21) Appl. No.: 14/060,405

(22) Filed: Oct. 22, 2013

(65) Prior Publication Data
US 2015/0112645 A1    Apr. 23, 2015

(51) Int. Cl.
*G06F 17/50* (2006.01)
*G06T 7/33* (2017.01)
*G06T 7/521* (2017.01)
*G06K 9/00* (2006.01)
(Continued)

(52) U.S. Cl.
CPC ............... *G06F 17/50* (2013.01); *G06T 7/33* (2017.01); *G06T 7/521* (2017.01); *G06K 9/00664* (2013.01); *G06K 9/00671* (2013.01); *G06K 9/623* (2013.01); *G06T 7/73* (2017.01);
(Continued)

(58) Field of Classification Search
None
See application file for complete search history.

(56) References Cited

U.S. PATENT DOCUMENTS

| 5,581,259 A * | 12/1996 | Schipper | G01C 21/20 |
| | | | 342/357.31 |
| 6,424,351 B1 * | 7/2002 | Bishop | G06T 15/04 |
| | | | 345/427 |

(Continued)

FOREIGN PATENT DOCUMENTS

| CN | 101984463 A | 3/2011 |
| CN | 103295239 A | 9/2013 |

OTHER PUBLICATIONS

Y. Cao, M. Y. Yang, J. McDonald, "Robust Alignment of Wide Baseline Terrestrial Laser Scans via 3D Viewpoint Normalization", pp. 455-462, IEEE 2010.*

(Continued)

*Primary Examiner* — Kibrom K Gebresilassie
(74) *Attorney, Agent, or Firm* — Maschoff Brennan

(57) ABSTRACT

A method of determining a registration between Scanworlds may include determining a first viewpoint of a setting based on first point data of a first Scanworld. The first Scanworld may include information about the setting as taken by a first laser scanner at a first location. The method may further include determining a second viewpoint of the setting based on second point data of a second Scanworld. The second Scanworld may include information about the setting as taken by a second laser scanner at a second location. The method may further include generating a first rectified image based on the first viewpoint and generating a second rectified image based on the second viewpoint. Additionally, the method may include determining a registration between the first Scanworld and the second Scanworld based on the first viewpoint and the second viewpoint.

20 Claims, 4 Drawing Sheets

(51) Int. Cl.
*G06K 9/62* (2006.01)
*G06T 7/73* (2017.01)

(52) U.S. Cl.
CPC .......... *G06T 2207/10028* (2013.01); *G06T 2207/20076* (2013.01)

(56) References Cited

U.S. PATENT DOCUMENTS

| | | | | |
|---|---|---|---|---|
| 7,440,591 | B1* | 10/2008 | McCusker | G06K 9/0063 |
| | | | | 382/109 |
| 8,655,513 | B2* | 2/2014 | Vanek | G01S 17/58 |
| | | | | 356/4.01 |
| 9,377,413 | B2* | 6/2016 | Hermary | G01B 11/245 |
| 9,380,292 | B2* | 6/2016 | McNamer | G06T 7/0075 |
| 2002/0128742 | A1* | 9/2002 | Zieverink | A44C 27/00 |
| | | | | 700/159 |
| 2004/0218815 | A1* | 11/2004 | Iizuka | G06K 9/522 |
| | | | | 382/209 |
| 2005/0283294 | A1* | 12/2005 | Lehman, Jr. | G05D 1/0236 |
| | | | | 701/50 |
| 2007/0122060 | A1* | 5/2007 | Hardy | G06T 7/0026 |
| | | | | 382/286 |
| 2008/0221843 | A1* | 9/2008 | Shenkar | G06T 17/05 |
| | | | | 703/1 |
| 2009/0256412 | A1* | 10/2009 | Nieto | E21C 39/00 |
| | | | | 299/18 |
| 2011/0255775 | A1 | 10/2011 | McNamer | |
| 2013/0208997 | A1* | 8/2013 | Liu | G06T 3/20 |
| | | | | 382/284 |
| 2013/0308860 | A1* | 11/2013 | Mainali | G06K 9/4671 |
| | | | | 382/170 |
| 2014/0049537 | A1* | 2/2014 | Sahoo | G06T 19/006 |
| | | | | 345/419 |
| 2014/0247280 | A1* | 9/2014 | Nicholas | G06F 3/011 |
| | | | | 345/633 |
| 2014/0334554 | A1* | 11/2014 | Walsh | H04N 19/85 |
| | | | | 375/240.26 |
| 2016/0012588 | A1* | 1/2016 | Taguchi | G06T 7/0018 |
| | | | | 348/46 |

OTHER PUBLICATIONS

G. Baatz, K. Koser, D. Chen, R. Grzeszczuk, and M. Pollefeys, "Leveraging 3D City Models for Rotation Invariant Place-of-Interest Recognition", pp. 315-334, 2011.*
Yanpeng, Cao et al., "Robust alignment of wide baseline terrestrial laser scans via 3D viewpoint normalization", Applications of Computer Vision, Jan. 5, 2011, pp. 455-462, 2011 IEEE Workshop on.

* cited by examiner

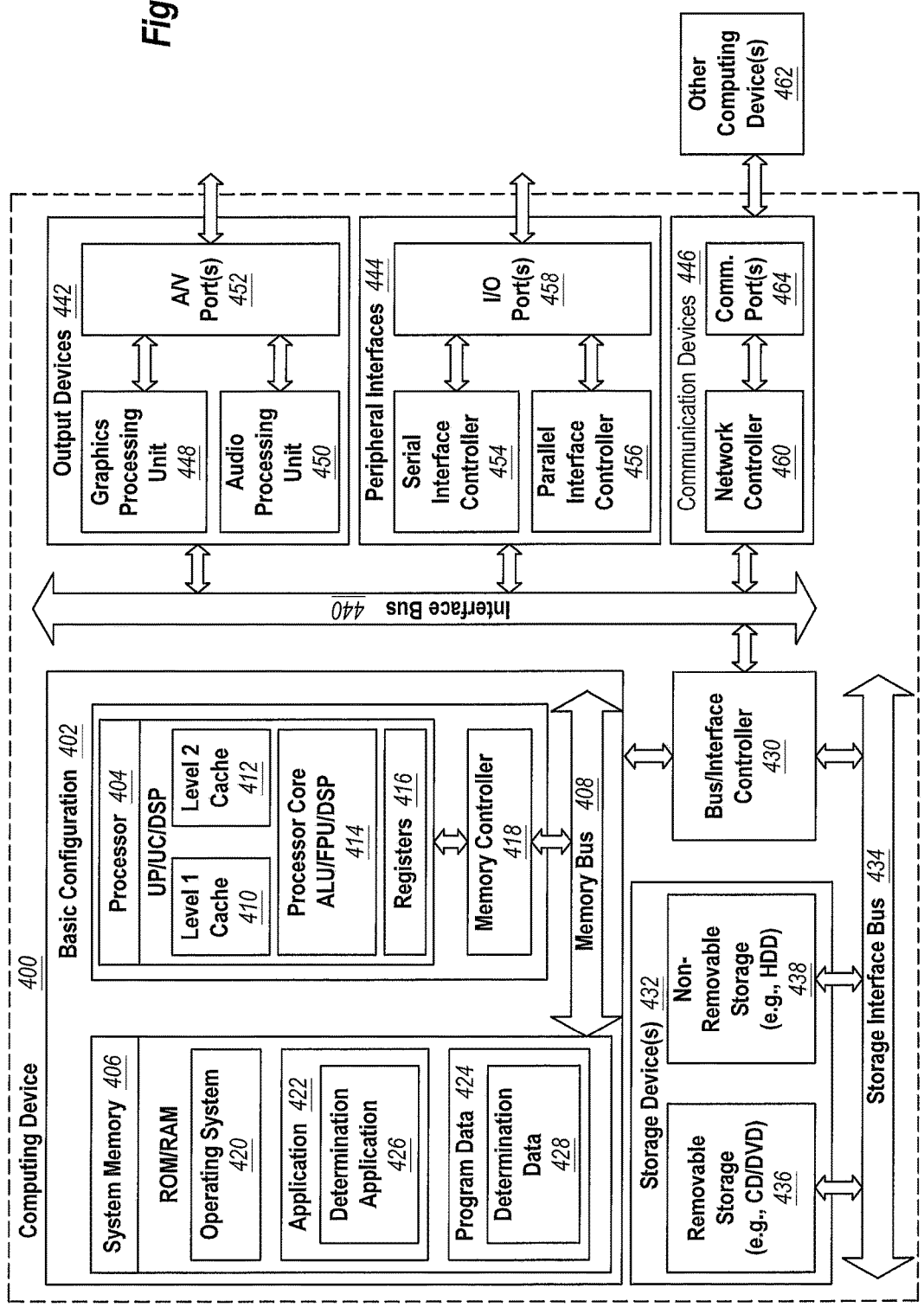

REGISTRATION OF MULTIPLE LASER SCANS

FIELD

The embodiments discussed herein are related to registration of multiple laser scans.

BACKGROUND

Laser scanning is used to survey many different settings such as construction sites, historical buildings, industrial facilities or any other applicable setting. The laser scanning may be used to obtain accurate three-dimensional (3D) models of the settings. Many times multiple scans are taken of a setting at multiple locations and the multiple scans are combined in order to obtain a full 3D model of the setting. The combination of scans often includes determining the relative position of a location of the setting in one of the scans with respect to the position of the same location of the setting in another scan, which may be referred to as "scan registration."

SUMMARY

According to at least one embodiments, a method of determining a registration between Scanworlds may include determining a first viewpoint of a setting based on first point data of a first Scanworld. The first Scanworld may include information about the setting as taken by a first laser scanner at a first location and the first point data may indicate a three-dimensional (3D) geometry of the setting. The method may further include determining a second viewpoint of the setting based on second point data of a second Scanworld. The second Scanworld may include information about the setting as taken by a second laser scanner at a second location and the second point data may indicate the 3D geometry of the setting. The method may further include generating a first rectified image based on the first viewpoint and generating a second rectified image based on the second viewpoint. Additionally, the method may include determining a registration between the first Scanworld and the second Scanworld based on the first viewpoint and the second viewpoint.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which:

FIG. 4 is a block diagram illustrating an example computing device that is arranged for determining a registration between Scanworlds.

DESCRIPTION OF EMBODIMENTS

Figure 1:
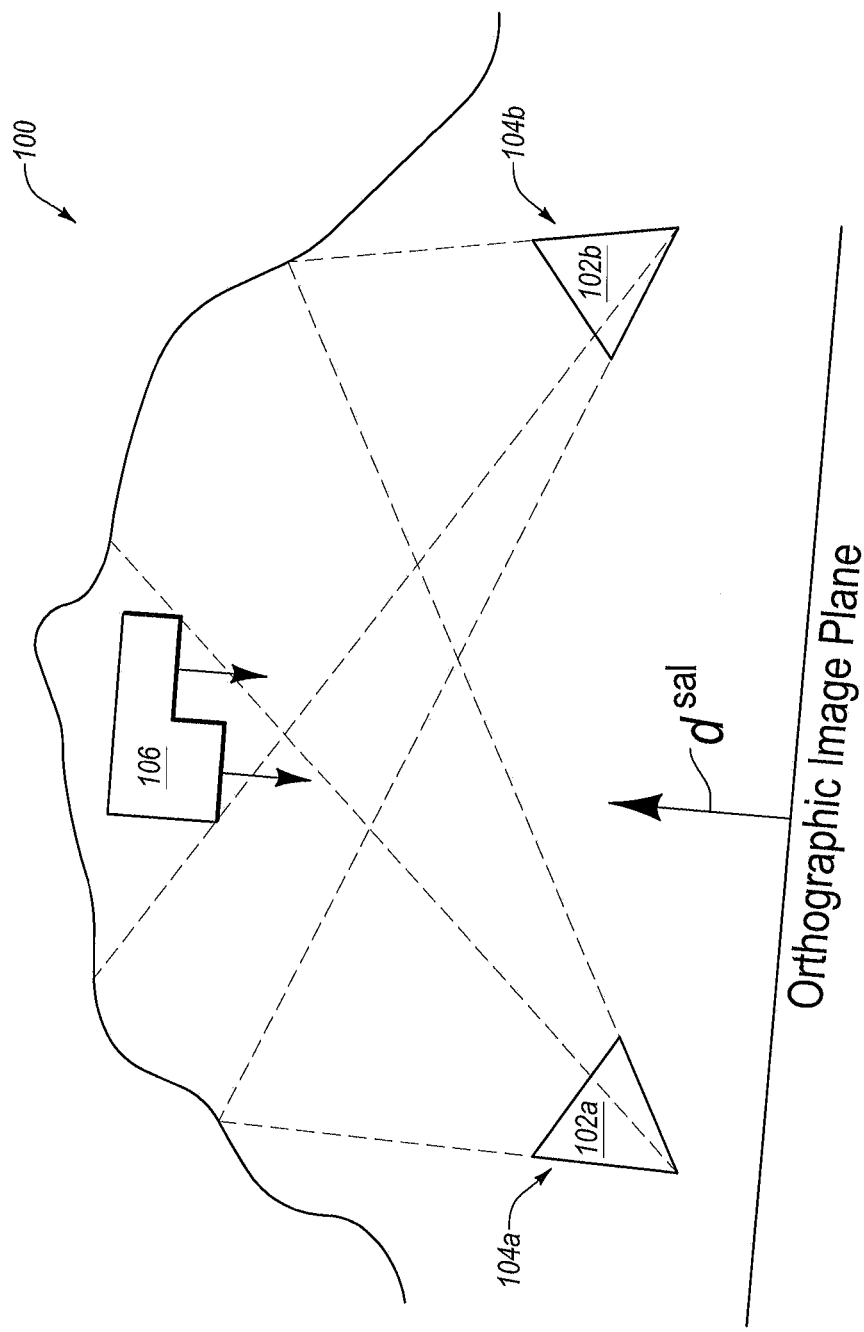
FIG. 1 illustrates an example setting that may be scanned by one or more scanning lasers.

A laser scanner collects data about a setting by scanning the setting with a laser and collecting thousands, millions or even billions of points of three-dimensional position information associated with the setting. The points and associated information may be saved as point data, which may be collected as a "point cloud." In some embodiments, the points may be collected so densely that the associated point data may be used to effectively re-create a scene of the setting scanned by the laser scanner.

Many laser scanners also include one or more cameras that are configured to take pictures of the setting such that one or more images of the setting may be generated by the laser scanner. The images and associated image data may be combined with and mapped to the points of the point data to generate a more complete re-creation of the scene than if only images or point data were used. The points and associated point data and/or the images and associated image data taken by a laser scanner at a particular position may be referred to as a "Scanworld." Additionally, the point data and image data in a Scanworld may be referred to as a Scanworld data set. In the present disclosure, the terms "Scanworld" and "Scanworld data set" may be used interchangeably at times. Further, the terms "images" and "image data" may be used interchangeably at times as well as the terms "points" and "point data." In some embodiments, the laser scanner may be configured to generate the images based on information included in the point cloud as measured by the laser of the laser scanner instead of images taken by one or more cameras. For example, the images may be generated based on point intensity or point colors of the points as recorded by the laser and included in the point data.

Many times multiple scans are taken of a setting at multiple locations to generate multiple Scanworlds. As disclosed in further detail below, the images and point data included in the multiple Scanworlds may be used to determine the relative position of a point associated with a location of the setting in one of the Scanworlds with respect to the position of a corresponding point associated with the same location in another Scanworld. A transformation that allows points and images from one Scanworld to be mapped to points and images of another Scanworld may be referred to as a "scan registration." The scan registrations for Scanworlds associated with a particular setting may be used to generate a three-dimensional (3D) model of the particular setting by combining the point and image data from different Scanworlds.

In some embodiments, the scan registration may be performed to determine one or more transformation tuples $\{S,R,T\}$ between the Scanworlds. A transformation tuple $\{S,R,T\}$ may represent a scaling ("S"), a rotation ("R"), and a translation ("T") of a point in one Scanworld with respect to a corresponding point in another Scanworld.

For example, a first Scanworld and a second Scanworld may be associated with a particular setting. Additionally, the first Scanworld may have a point associated with a location of the particular setting with a coordinate "A" ("$p_A$") in the first Scanworld. The second Scanworld may have a corresponding point associated with the same location with a coordinate "B" ("$p_B$") in the second Scanworld. Additionally, the relationship of coordinates in the first Scanworld with respect to the relationship of coordinates in the second Scanworld may be represented by a transformation tuple $\{S,R,T\}_{AB}$ such that the location of "$p_B$" with respect to the coordinate system of the first Scanworld may be represented by the following expression:

$p_B = S*R*p_A + T$

Embodiments of the present disclosure are now explained with reference to the accompanying drawings.

FIG. 1 illustrates an example setting 100 that may be scanned by one or more scanning lasers, according to at least one embodiment described herein. In the illustrated embodiment, a first scanning laser 102a may be configured to scan the setting 100 at a first location 104a to generate a first Scanworld of the setting 100 that includes a first point-cloud and first images of the setting 100. Additionally, a second scanning laser 102b may be configured to scan the setting 100 at a second location 104b to generate a second Scanworld of the setting 100 that includes a second point-cloud and second images of the setting 100.

In the illustrated example, the setting 100 may include a building 106 such that point data of the first and second point-clouds of the first and second Scanworlds may include information associated with the 3D geometry and general look of the building 106. Additionally, the images included in the first and second Scanworlds may include information surrounding the overall look and color of the building 106.

In some embodiments, the first scanning laser 102a may be configured to also generate the second Scanworld instead of the second scanning laser 102b by moving the first scanning laser to the second location 104b and performing a scan at the second location 104b. Similarly, the second scanning laser 102b may be configured to also generate the first Scanworld instead of the first scanning laser 102a by moving the second scanning laser to the first location 104a and performing a scan at the first location 104a.

A registration (e.g., transformation tuple) of the first Scanworld and the second Scanworld may be determined such that a 3D model of the setting 100 may be generated. In some embodiments, the registration may be determined according to the methods 200 and 300 described below with respect to FIGS. 2 and 3.

Figure 2:
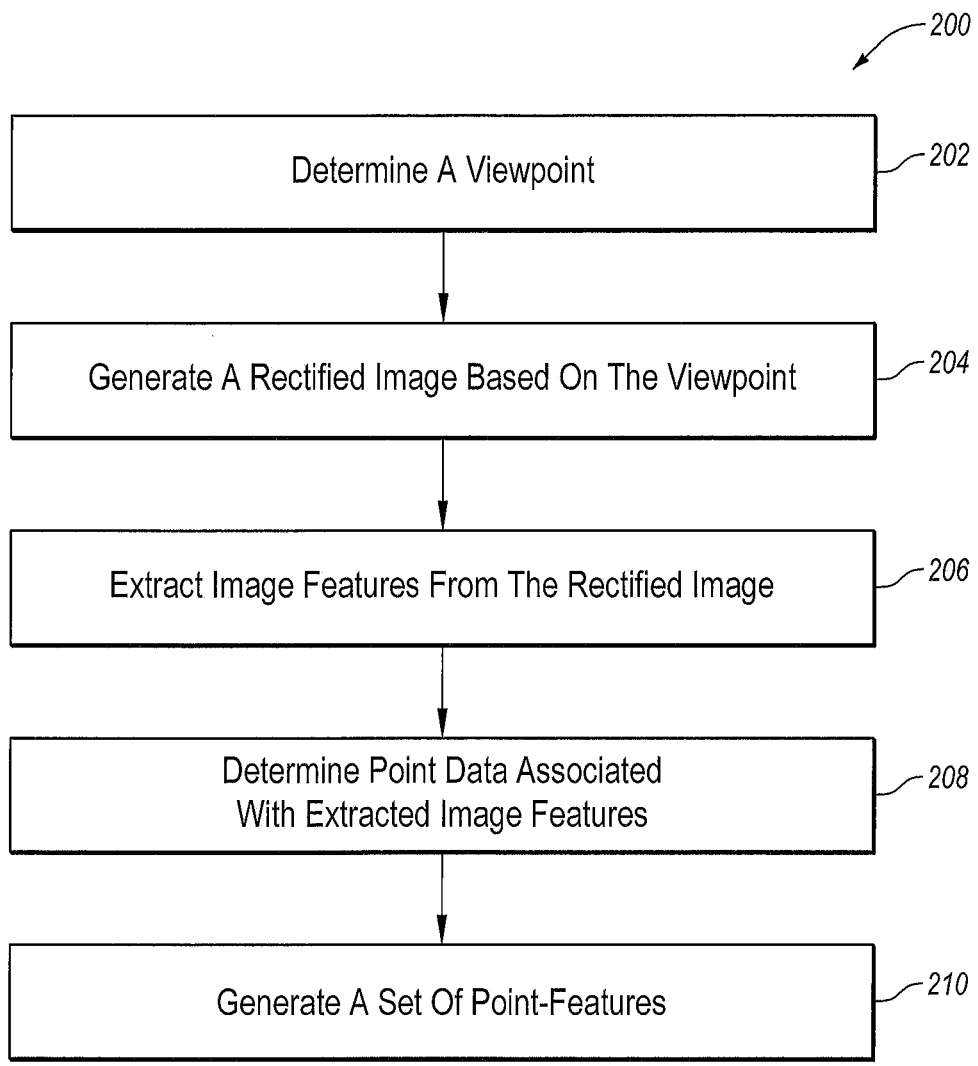
FIG. 2 illustrates a flow diagram of an example method for generating a set of image features and associated points of a Scanworld.

FIG. 2 illustrates a flow diagram of an example method 200 for generating a set of image features and associated points of a Scanworld, according to at least one embodiment described herein. The set of image features and associated points may be referred to as "point-features" and may be used to determine a registration associated with the Scanworld and another Scanworld, as described in further detail with respect to the method 300 of FIG. 3. To help explain the method 200, the elements of FIG. 1 including the first and second Scanworlds described above are referenced. However the principles described may be applied to any applicable Scanworlds derived from any applicable setting.

The method 200 may begin, and at a block 202 one or more viewpoints from a Scanworld may be determined. The viewpoints may be determined based on the viewpoints likely being similar in another Scanworld. For example, at block 202 a first viewpoint from the first Scanworld described with respect to FIG. 1 may be determined based on the first viewpoint likely having a similar perspective of the setting 100 as a second viewpoint in the second Scanworld. Having viewpoints of the first and second Scanworlds with similar perspectives may facilitate identifying common features in the first and second Scanworlds, which may in turn facilitate determining a registration between the first and second Scanworlds.

In some embodiments, one or more of the viewpoints may be selected based off of default viewpoints, such as cube map projections. For example, with respect to FIG. 1, viewpoints associated with a first cube map may be generated for the first Scanworld from the perspective of a first cube if the first cube were located at the first location 104a. Similarly, viewpoints associated with a second cube map may be generated for the second Scanworld from the perspective of a second cube if the second cube were located at the second location 104b.

In some embodiments, one or more viewpoints may also be selected based off of information that may be derived from the point data included in the Scanworlds. For example, one or more viewpoints may be selected based on one or more salient directions that may be derived from the point data in each of the Scanworlds. Salient directions may be dominant directions associated with the setting corresponding to the Scanworlds. For example, the salient directions may include, by way of example and not limitation, surface normals, vanishing points, symmetry, gravity or other dominant directions that may be obtained from the point data of the Scanworlds. The salient directions may accordingly be used to select viewpoints associated with the Scanworlds that may have similar perspectives. In some embodiments, the viewpoints may be selected off of salient directions and/or default viewpoints.

The salient directions may be determined based on the point data according to any suitable method or process. For example, in some embodiments, the laser scanners 102a and 102b may include tilt sensors that may detect the direction of gravity, which may be indicated by the point data in the first Scanworld and the second Scanworld. Accordingly, salient directions that include the direction of gravity and its opposite (e.g., salient directions that point down and up) may be derived from the point data of the first Scanworld and the second Scanworld.

As another example, the salient directions may be determined based on peaks of distributions in common surface normals, which may be included in the point data and which may indicate dominant features of the setting associated with the Scanworlds. For example, the building 106 of FIG. 1 may include a dominant face with a surface normal depicted in FIG. 1 by the arrows extending from the building 106. The point data of the first point-cloud of the first Scanworld and/or the point data of the second point-cloud of the second Scanworld may accordingly indicate a high distribution of surface normals in the direction of the arrows depicted by the arrows extending from the building 106. A salient direction ("$d^{sal}$") that is parallel to and opposite of the surface normal of the building 106, as indicated in FIG. 1, may accordingly be selected. A first viewpoint taken from the first location 104a in the direction of the salient direction ("$d^{sal}$") may be similar to a second viewpoint taken from the second location 104b in the direction of the salient direction ("$d^{sal}$") because the first and second viewpoints may be from similar perspectives of looking at the setting 100 in the salient direction ("$d^{sal}$").

At block 204, a rectified image for each of the viewpoints generated at block 202 may be generated based on the point-cloud and images included in the Scanworld. The rectified images may each include an image portion that represents the overall appearance of the setting at the viewpoint associated with the associated rectified image. Additionally, point data and its associated points may be mapped to the rectified images such that 3D geometry information may also be included with the rectified images.

The rectified images may be generated via a particular perspective associated with their respective viewpoints such that they may be images that represent a perspective or orthographic view of the setting associated with their associated Scanworld from the perspective of their respective viewpoints. For example, in some embodiments, the rectified images may be generated from the perspectives of orthographic image planes that are perpendicular to the respective salient directions associated with the viewpoints.

By way of example, a first rectified, image that is orthographically projected may be generated from the first Scanworld described with respect to FIG. 1 based on the salient direction "$d^{sa1}$" and an orthographic image plane 108 that may be perpendicular to the salient direction "$d^{sa1}$." The first rectified image may be generated based on the salient direction "$d^{sa1}$" and the orthographic image plane 108 such that the first rectified image substantially depicts the setting 100 along the orthographic image plane 108 from the perspective of facing the setting 100 in the salient direction "$d^{sa1}$" and centered at the first location 104a.

Similarly, as another example, a second rectified image, that is orthographically projected with respect to the orthographic image plane 108 may also be generated from the second Scanworld described with respect to FIG. 1 based on the salient direction "$d^{sa1}$" and the orthographic image plane 108. The second rectified image may be generated based on the salient direction "$d^{sa1}$" and the orthographic image plane 108 such that the second rectified image substantially depicts the setting 100 along the orthographic image plane 108 from the perspective of facing the setting 100 in the salient direction "$d^{sa1}$" and centered at the second location 104b.

As another example of a perspective view, the setting associated with a particular Scanworld may include large cylindrical holding tanks such as those found in chemical processing plants. These slowly curving cylinders may be thought of as slowly curving walls with dominant surface normals that may be associated with one or more salient directions. The rectified images associated with the particular Scanworld may therefore be projected along the surface of one or more of the tanks as a perspective view in a similar manner that the rectified images may be projected as orthographic images into an orthographic image plane.

In some embodiments, one or more of the rectified images may be generated based on multiple images and associated point data included in the Scanworld to generate the desired viewpoint because the laser scanner position associated with the Scanworld may not have been placed in a position to capture the image and point data from the desired viewpoint for the rectified images. Accordingly, in some instances, the rectified images, particularly those that employ an orthographic projection, may include gaps in information associated with the desired viewpoints for the rectified images. In these and other instances, infilling and/or inpainting may be performed to help fill in the missing information and data. Examples of infilling and inpainting methods that may be used are a Navier-Stokes method, or an Alexandru Teleau method, which may be commonly available in open source software.

At block 206, image features may be extracted from the rectified images generated in block 204. The extracted image features may include key or dominant features that may be included in the rectified images. Additionally, some algorithms configured to extract image features may look for specially placed features, such as targets and labels, such that the extracted image features may belong to a relatively narrow class of objects. In some embodiments, the image features may be extracted using any suitable program or algorithm such as a Scale-Invariant Feature Transform (SIFT) algorithm, a Speeded Up Robust Features (SURF) algorithm, a Features from Accelerated Segment Test (FAST) algorithm, a Binary Robust Independent Elementary Features (BRIEF) algorithm, an Oriented FAST and Rotated BRIEF (ORB) algorithm, a Maximally Stable Extremal Regions algorithm (MSER), a Harris Corners algorithm, or any other suitable feature detection algorithm.

In some embodiments, a descriptor detection algorithm may be applied to the extracted image features to facilitate determining whether image features of rectified images from different Scanworlds correspond to each other, as detailed further below with respect to FIG. 3. For example, in some instances the physical sizes of one or more extracted image features may be determined using a descriptor detection algorithm. As another example, in some embodiments, the point data may include information regarding the orientations of the extracted image features. Accordingly, the orientations of the extracted image features may be extracted as descriptors. As explained in further detail below with respect to FIG. 3, in some embodiments, the descriptors may be used to discriminate between image features of different Scanworlds since properties of the image features such as size and/or orientation may be known. In some instances, not all of the extracted image features will have a determined descriptor. Additionally, in some instances the algorithm used to extract the image features may not support descriptor identification and determination. Furthermore, as indicated above, the extracted image features may include specially placed features such that a feature descriptor may not be used because the extracted image features may already belong to a relatively narrow class of objects.

One or more of the extracted image features may be included in a set of extracted image features. In some embodiments, all of the extracted image features may be included in the set of extracted image features. In other embodiments, only image features with determined descriptors may be included in the set of extracted image features to reduce the size of the set of extracted image features.

At block 208, point data from the point cloud that is associated with the set of extracted image features may be determined. The point data may correspond with the same locations in the setting as the extracted image features and may give additional information about the extracted image features such as the 3D geometry of the extracted image features. In some instances, the extracted image features may not have associated point data and the extracted image features that do not have associated point data may be discarded or ignored. At block 210, a set of point-features may be generated. The set of point-features may include the extracted image features and associated point data. Additionally, when descriptors have been determined for the extracted image features, the point-features may include the associated descriptors.

Accordingly, the method 200 may be used to generate a set of point-features for a Scanworld, where the set of point-features includes image features and associated points of the Scanworld. The method 200 may be applied to multiple Scanworlds—e.g., the first and second Scanworlds associated with FIG. 1—such that a set of point-features may be generated for each of the Scanworlds. As described in detail below with respect to FIG. 3, the sets of point-features from the different Scanworlds may be compared to determine a registration between the Scanworlds.

Figure 3:
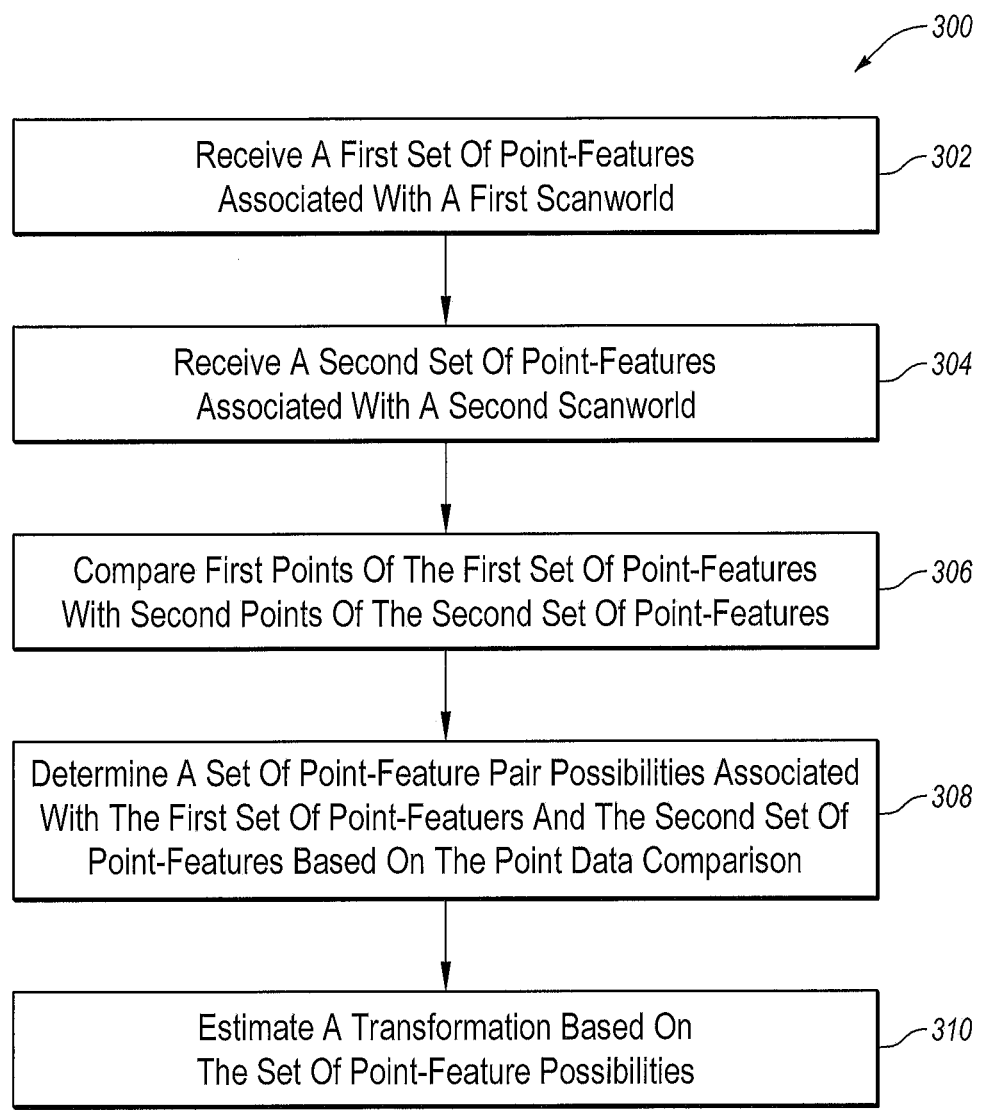
FIG. 3 illustrates a flow diagram of an example method for determining a registration between Scanworlds.

FIG. 3 illustrates a flow diagram of an example method 300 for determining a registration between Scanworlds, according to at least one embodiment described herein. To help explain the method 300, the elements of FIG. 1 including the first and second Scanworlds described above are referenced. However the principles described may be applied to any applicable Scanworlds derived from any applicable setting.

The method 300 may begin, and at block 302, a first set of point-features associated with a first Scanworld (e.g., the first Scanworld associated with FIG. 1) may be received. At block 304, a second set of point-features associated with a second Scanworld (e.g., the second Scanworld associated with FIG. 1) may be received. The second Scanworld may be associated with the same setting as the first Scanworld, but may be obtained at a different location than the first Scanworld. In some embodiments, the first and/or second set of point-features may be generated using method 200 described above.

At block 306, point matching may be performed in which point data of first points of the first set of point-features may be compared with point data of second points of the second set of point-features. The comparison of the point data associated with the first and second points may also be referred to as a comparison between the first and second points. The first and second points may be compared to determine which point-features of the first set of point-features may correspond with point-features of the second set of point-features. For example, the comparison between the first and second points may indicate which point-features of the first and second set of point-features may correspond with the same location in the setting associated with the first and second Scanworlds by determining which locations and/or objects associated with the point-features have similar 3D geometry, which is indicated by the first and second points. Given a set of possible matches and a candidate transformation, a number of well-known consensus methods may be applied to determine the most likely correct transformation between the sets, as detailed further below.

In some embodiments, when the point-features of the first and second sets of point-features include descriptors, the descriptors may also be compared to determine which point-features may correspond with the same location. As such, image descriptor sets may be compared and likely matches may be determined using the descriptors themselves. Additionally, because point data as well as image data may be included in a Scanworld data set, descriptors may be associated with the sizes of objects associated with point-features. The sizes may be compared to determine whether the point-features may correspond with the same location in the setting or a different location. By way of example, descriptors that indicate objects of different sizes between a pair of point-features may be used to eliminate those point-features as corresponding to the same location in the setting. The descriptor matching may be performed before or after the point matching, but may be more commonly performed before the point matching to reduce the amount of point matching performed.

For example, in some embodiments, the points of each point-feature in the first set of point-features may be compared with the points of each point-feature in the second set of point-features to determine which point-features may correspond with each other, which may be computationally intensive. Therefore, in some embodiments, descriptor matching may be performed before point matching to reduce the number of comparisons that may be made during point matching.

At block 308, a set of point-feature pair possibilities may be determined based on the point matching. Each point-feature pair possibility may include a point-feature from the first set of point-features and a point-feature from the second set of point-features. The point-features of each point-feature pair possibilities may include similar 3D geometry characteristics as indicated by their respective points, which may indicate that they may be associated with the same location in the setting. Additionally, in embodiments when the descriptors are included in the point-features, the point-features of each point-feature pair possibilities may include similar descriptor information, which may also indicate that they may be associated with the same location in the setting.

At block 310, a transformation tuple for the first and second Scanworlds may be estimated based on the point-feature pair possibilities. For example, transformations may be determined for the point-feature pair possibilities and those transformations that are consistent with each other may indicate an approximation of or the actual transformation tuple associated with the first and second Scanworlds. The point-feature pair possibilities that have transformations that are not consistent with a significant amount of other point-feature pair possibilities may not represent the transformation tuple associated with the first and second Scanworlds and may be referred to as false-positives or outliers.

In some instances, the number of point-feature pair possibilities may be small enough that transformations may be determined for each of the point-feature pair possibilities to determine the estimated transformation tuple. However, in other instances, the number of point-feature pair possibilities may make an analysis of all of the point-feature pair possibilities computationally burdensome. Accordingly, in some embodiments, a RANdom SAmple Consensus (RANSAC) algorithm may be used to determine one or more candidate transformation tuples and to determine which candidate transformation tuple likely, or most likely, represents an approximation of or the actual transformation tuple associated with the first and second Scanworlds.

The RANSAC algorithm may select a random subset of point-feature pair possibilities and may determine a candidate transformation tuple based on the point-feature pair possibilities of the selected subset. The candidate transformation tuple may then be applied to a larger set of the point-feature pair possibilities (e.g., the entire set of point-feature pair possibilities) to determine a set of "inliers"— e.g., those point-feature pair possibilities that are likely consistent with the candidate transformation tuple. The RANSAC algorithm may perform this process multiple times to generate multiple candidate transformation tuples. It may then be determined which candidate transformation tuple may most closely represent the transformation tuple associated with the first and second Scanworlds.

For example, in some embodiments, the candidate transformation tuple that returns the largest set of inliers may be selected as the estimated transformation tuple. In these or other embodiments, point-feature pair possibilities in the inlier sets associated with the candidate transformation tuples may be weighted based on a desired metric (e.g., as a function of distances) such that the point-feature pair possibilities that have the desired metric may be weighted more heavily as inliers than those that do not, or do not to the same degree.

In some embodiments, the selected estimated transformation tuple may be refined such that it may more accurately represent the transformation tuple associated with the first and second Scanworlds. For example, in some embodiments, a least squares operation or other performance metric may be applied to the set of inliers associated with the estimated transformation tuple to refine the inliers. The estimated transformation tuple may be modified based on the refined inliers.

In these or other embodiments, the estimated transformation tuple may be refined by comparing and aligning the inlier set associated with the first and second Scanworlds with another inlier set associated with another pair of Scanworlds that is associated with the same setting as the first and second Scanworlds and that includes at least one Scanworld that is not the first Scanworld or the second Scanworld. The inlier sets may be used to optimize the pose using any suitable joint pose optimization such as pose graph optimization and bundle-adjustment. In this context, the pose of a Scanworld may be the equivalent to a transformation tuple {S,R,T}. Given a set of pair-wise transformation tuples—referred to as a transformation tuple set {S,R,T}i—that includes the transformation tuple {S,R,T} the optimization may be applied to reduce geometric inconsistencies that may be present between the transformation tuples of the transformation tuple set {S,R,T}i to better refine the transformation tuple {S,R,T}.

In some embodiments, the pose may be aligned using the first Scanworld, the second Scanworld, or the viewpoint data. In some embodiments algorithms such as an Iterative Closest Point (ICP) algorithm may be used to refine the transformation tuple set {S, R, T}i. Iterative closest point may minimize alignment errors between point clouds using the entire point cloud and finding subsets which substantially overlap.

Accordingly, the method 300 may be used to determine a transformation tuple associated with the first and second Scanworlds, which may be used as a registration of the first and second Scanworlds. The registration of the first and second Scanworlds may be used with other registrations between other Scanworlds (including other registrations between the first Scanworld with another Scanworld that is not the second Scanworld, and vice versa) to generate a 3D model of the setting associated with the Scanworlds.

One skilled in the art will appreciate that, for this and other processes and methods disclosed herein, the functions performed in the processes and methods of FIGS. 2 and 3 may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, the methods 200 and 300 is not limited to application to the first and second Scanworlds of FIG. 1 and may be applied to any number of Scanworlds and sets of Scanworlds associated with any applicable setting. Additionally, as mentioned above, in some embodiments, the images (including the image portions of the rectified images) may be generated based on information included in the point cloud as measured by the laser of a laser scanner instead of images taken by one or more cameras. For example, the images may be generated based on point intensity or point colors of the points as recorded by the laser of the laser scanners 102a and 102b.

FIG. 4 is a block diagram illustrating an example computing device 400 that is arranged for determining a registration between Scanworlds, according to at least one embodiment of the present disclosure. In a very basic configuration 402, the computing device 400 typically includes one or more processors 404 and a system memory 406. A memory bus 408 may be used for communicating between the processor 404 and the system memory 406.

Depending on the desired configuration, the processor 404 may be of any type including but not limited to a microprocessor (µP), a microcontroller (µC), a digital signal processor (DSP), or any combination thereof. The processor 404 may include one more levels of caching, such as a level one cache 410 and a level two cache 412, a processor core 414, and registers 416. An example processor core 414 may include an arithmetic logic unit (ALU), a floating point unit (FPU), a digital signal processing core (DSP Core), or any combination thereof. An example memory controller 418 may also be used with processor 404, or in some implementations memory controller 418 may be an internal part of processor 404.

Depending on the desired configuration, the system memory 406 may be of any type including but not limited to volatile memory (such as RAM), non-volatile memory (such as ROM, flash memory, etc.) or any combination thereof. The system memory 406 may include an operating system 420, one or more applications 422, and program data 424. The application 422 may include one or more Scanworld registration algorithms that are arranged to perform one or more of the operations associated with the methods 200 and 300 described above. Program data 424 may include Scanworld registration data 428 that may be useful for determining the Scanworld registration, as is described herein. For example the program data 424 may include the image and point data of the first and second Scanworlds. In some embodiments, the application 422 may be arranged to operate with program data 424 on the operating system 420 such that the Scanworld registration may be performed. This described basic configuration 402 is illustrated in FIG. 4 by those components within the inner dashed line.

The computing device 400 may have additional features or functionality, and additional interfaces to facilitate communications between the basic configuration 402 and any required devices and interfaces. For example, a bus/interface controller 430 may be used to facilitate communications between the basic configuration 402 and one or more data storage devices 432 via a storage interface bus 434. Data storage devices 432 may be removable storage devices 436, non-removable storage devices 438, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 406, removable storage devices 436 and non-removable storage devices 438 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by the computing device 400. Any such computer storage media may be part of the computing device 400.

The computing device 400 may also include an interface bus 440 for facilitating communication from various interface devices (e.g., output devices 442, peripheral interfaces 444, and communication devices 446) to the basic configuration 402 via the bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 456, which may be configured to communicate with external devices such as input devices (e.g., keyboard, mouse, pen, voice input device, touch input device, etc.) or other peripheral devices (e.g., printer, scanner, etc.) via one or more I/O ports 458. An example communication device 446 includes a network controller 460, which may be arranged to facilitate communications with one or more other computing devices 462 over a network communication link via one or more communication ports 464.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 40 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. The computing device 400 may also be implemented as a personal computer including both laptop computer and non-laptop computer configurations.

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible sub ranges and combinations of sub ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into sub ranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of determining a registration between Scanworlds, wherein each Scanworld includes point data and image data taken by a laser scanner at a location, the method comprising:
   determining a salient direction based on first point data of a first Scanworld and second point data of a second Scanworld, the first point data taken by a first laser scanner at a first location and indicating a three-dimensional (3D) geometry of a setting, and the second point data taken by a second laser scanner at a second location, the second point data indicating the 3D geometry of the setting;
   determining an orthographic image plane substantially orthogonal to the salient direction;
   determining a first viewpoint of the setting from the first location in the salient direction;
   determining a second viewpoint of the setting from the second location in the salient direction;
   generating a first orthographically projected rectified image based on the salient direction, the orthographic image plane, and first image data of the first Scanworld taken at the first location such that the first rectified image substantially depicts the setting along the orthographic image plane from a perspective of facing the setting in the salient direction and centered at the first location;
   generating a second orthographically projected rectified image based on the salient direction, the orthographic image plane, and second image data of the second Scanworld taken at the second location such that the second rectified image substantially depicts the setting along the orthographic image plane from the perspective of facing the setting in the salient direction and centered at the second location;
   determining an objective physical size of a first object associated with a first point-feature generated based on the first Scanworld;
   determining an objective physical size of a second object associated with a second point-feature generated based on the second Scanworld; and
   determining a registration between the first Scanworld and the second Scanworld based on the first rectified image and the second rectified image, including:
      comparing the determined objective physical size of the first object with the determined objective physical size of the second object; and
      in response to determining that the determined objective physical size of the first object is different from the determined objective physical size of the second object, determining that the first point-feature and the second point-feature do not correspond to a same location of the setting;
   wherein the point data and image data are used to generate a re-creation of the setting.

2. The method of claim 1, wherein the first laser scanner and the second laser scanner are the same laser scanner.

3. The method of claim 1, wherein the salient direction is determined based on at least one of surface normals, vanishing points, symmetry, and gravity.

4. The method of claim 1, further comprising:
   extracting one or more first descriptors from the first rectified image;
   extracting one or more second descriptors from the second rectified image;
   comparing the one or more first descriptors with the one or more second descriptors; and
   determining the registration based on the comparison of the one or more first descriptors with the one or more second descriptors.

5. The method of claim 1, further comprising estimating a transformation tuple associated with the first and second Scanworlds based on the first rectified image and the second rectified image to determine the registration between the first Scanworld and the second Scanworld.

6. The method of claim 5, further comprising applying a performance metric to inlier point-feature pair possibilities to refine the transformation tuple.

7. The method of claim 5, further comprising refining the transformation tuple based on another transformation tuple determined for a pair of Scanworlds associated with the setting that excludes at least one of the first Scanworld and the second Scanworld.

8. The method of claim 5, further comprising:
   applying point-cloud matching between a first point-cloud included in the first Scanworld and a second point-cloud included in the second Scanworld; and
   refining the transformation tuple based on the point-cloud matching.

9. The method of claim 1, further comprising:
   extracting a first set of point-features from the first rectified image, the first set of point-features including first image features included in the first rectified image and associated first point data that indicates a 3D geometry of the first image features;
   extracting a second set of point-features from the second rectified image, the second set of point-features including second image features included in the second rectified image and associated second point data that indicates a 3D geometry of the second image features;
   determining a set of point-feature pair possibilities from the first set of point-features and the second set of point-features based on the associated first point data included in the first set of point-features and based on the associated second point data included in the second set of point-features; and
   determining the registration between the first Scanworld and the second Scanworld based on the set of point-feature pair possibilities.

10. The method of claim 9, further comprising:
    extracting the first image features from the first rectified image;
    matching the associated first point data with the first image features to generate the first set of point-features;
    extracting the second image features from the second rectified image; and
    matching the associated second point data with the second image features to generate the second set of point-features.

11. The method of claim 9, further comprising excluding from the first image features and the second image features those image features that do not have associated point data.

12. The method of claim 9, further comprising applying a RANdom SAmple Consensus (RANSAC) algorithm to the point-feature pair possibilities to determine the registration between the first Scanworld and the second Scanworld.

13. A non-transitory computer-readable medium having encoded therein programing code executable by one or more processors to perform operations to determine a registration between Scanworlds, wherein each Scanworld includes point data and image data taken by a laser scanner at a location, comprising:
  determining a salient direction based on first point data of a first Scanworld and second point data of a second Scanworld, the first point data taken by a first laser scanner at a first location and indicating a three-dimensional (3D) geometry of a setting, and the second point data taken by a second laser scanner at a second location, the second point data indicating the 3D geometry of the setting;
  determining an orthographic image plane substantially orthogonal to the salient direction;
  determining a first viewpoint of the setting from the first location in the salient direction;
  determining a second viewpoint of the setting from the second location in the salient direction;
  generating a first orthographically projected rectified image based on the salient direction, the orthographic image plane, and first image data of the first Scanworld taken at the first location such that the first rectified image substantially depicts the setting along the orthographic image plane from a perspective facing the setting in the salient direction and centered at the first location,
  generating a second orthographically projected rectified image based on the salient direction the orthographic image plane, and second image data of the second Scanworld taken at the second location such that the second rectified image substantially depicts the setting along the orthographic image plane from the perspective of facing the setting in the salient direction and centered at the second location;
  determining an objective physical size of a first object associated with a first point-feature generated based on the first Scanworld;
  determining an objective physical size of a second object associated with a second point-feature generated based on the second Scanworld; and
  determining a registration between the first Scanworld and the second Scanworld based on the first rectified image and the second rectified image, including:
    comparing the determined objective physical size of the first object with the determined objective physical size of the second object; and
    in response to determining that the determined objective physical size of the first object is different from the determined objective physical size of the second object, determining that the first point-feature and the second point-feature do not correspond to a same location of the setting;
  wherein the point data and image data are used to generate a re-creation of the setting.

14. The computer-readable medium of claim 13, wherein the first laser scanner and the second laser scanner are the same laser scanner.

15. The computer-readable medium of claim 13, wherein the determining of the salient direction is based on at least one of surface normals, vanishing points, symmetry, and gravity.

16. The computer-readable medium of claim 13, wherein the operations further comprise:
  extracting one or more first descriptors from the first rectified image;
  extracting one or more second descriptors from the second rectified image;
  comparing the one or more first descriptors with the one or more second descriptors; and
  determining the registration based on the comparison of the one or more first descriptors with the one or more second descriptors.

17. The computer-readable medium of claim 13, wherein the operations further comprise estimating a transformation tuple associated with the first and second Scanworlds based on the first rectified image and the second rectified image to determine the registration between the first Scanworld and the second Scanworld.

18. The computer-readable medium of claim 17, wherein the operations further comprise refining the transformation tuple.

19. The computer-readable medium of claim 13, wherein the operations further comprise:
  extracting a first set of point-features from the first rectified image, the first set of point-features including first image features included in the first rectified image and associated first point data that indicates a 3D geometry of the first image features;
  extracting a second set of point-features from the second rectified image, the second set of point-features including second image features included in the second rectified image and associated second point data that indicates a 3D geometry of the second image features;
  determining a set of point-feature pair possibilities from the first set of point-features and the second set of point-features based on the associated first point data included in the first set of point-features and based on the associated second point data included in the second set of point-features; and
  determining the registration between the first Scanworld and the second Scanworld based on the set of point-feature pair possibilities.

20. The computer-readable medium of claim 19, wherein the operations further comprise applying a RANdom SAmple Consensus (RANSAC) algorithm to the point-feature pair possibilities to determine the registration between the first Scanworld and the second Scanworld.

* * * * *